United States Patent
Srinivas et al.

(10) Patent No.: US 11,811,415 B2
(45) Date of Patent: Nov. 7, 2023

(54) DIRECT DIGITAL SYNTHESIZER WITH FREQUENCY CORRECTION

(71) Applicant: BAE Systems Information and Electronic Systems Integration Inc., Nashua, NH (US)

(72) Inventors: Shailendra Srinivas, Nashua, NH (US); Joseph D. Cali, Merrimack, NH (US); Steven E. Turner, Nashua, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 17/351,529

(22) Filed: Jun. 18, 2021

(65) Prior Publication Data
US 2022/0407524 A1     Dec. 22, 2022

(51) Int. Cl.
| | | |
|---|---|---|
| *H03L 7/093* | (2006.01) | |
| *H03L 7/08* | (2006.01) | |
| *G06F 1/08* | (2006.01) | |
| *G06F 1/03* | (2006.01) | |
| *G06F 1/02* | (2006.01) | |
| *H04L 27/00* | (2006.01) | |

(52) U.S. Cl.
CPC .............. *H03L 7/093* (2013.01); *G06F 1/022* (2013.01); *G06F 1/0321* (2013.01); *G06F 1/08* (2013.01);
(Continued)

(58) Field of Classification Search
CPC ..... H03L 7/16; H03L 7/22; H03L 7/23; H03L 7/06; H03L 7/08; H03L 7/085;
(Continued)

(56) References Cited

U.S. PATENT DOCUMENTS

| | | | |
|---|---|---|---|
| 7,212,075 B2 * | 5/2007 | Young | ..................... H03L 1/022 331/158 |
| 9,225,350 B1 | 12/2015 | Schupbach | |

(Continued)

OTHER PUBLICATIONS

Staszewski, R.B. and Balsara, P.T., "Phase-Domain All-Digital Phase-Locked Loop," IEEE Transactions on Circuits and Systems—II: Express Briefs, vol. 52, No. 3. Mar. 2005. pp. 159-163.

(Continued)

*Primary Examiner* — Betsy Deppe
(74) *Attorney, Agent, or Firm* — Finch & Maloney PLLC; Gary McFaline

(57) ABSTRACT

A direct digital synthesizer (DDS) circuit. The circuit includes a first input to receive a first fixed frequency clock signal having a first frequency, a second input to receive a second fixed frequency clock signal having a second frequency lower than the first frequency, and an output to provide an output frequency that is based at least in part on a frequency control word (FCW). The DDS circuit may include a frequency correction circuit having a first input to receive the first clock signal, a second input to receive the second clock signal, and a third input to receive the FCW, and an output to provide a frequency error of the first clock signal, the frequency error determined using the second clock signal and FCW. Alternatively, or in addition to, the DDS circuit may include an all-digital phase lock loop to correct for frequency wander of the first clock signal.

15 Claims, 5 Drawing Sheets

(52) U.S. Cl.
CPC ............ *H03L 7/08* (2013.01); *H03L 2207/50* (2013.01); *H04L 2027/0065* (2013.01); *H04L 2027/0073* (2013.01)

(58) Field of Classification Search
CPC ..... H03L 7/093; H03L 2207/50; G06F 1/022; G06F 1/0321; G06F 1/08
See application file for complete search history.

(56) References Cited

U.S. PATENT DOCUMENTS

| | | | |
|---|---|---|---|
| 10,756,514 B1* | 8/2020 | Zhou | H01S 3/1305 |
| 10,992,301 B1 | 4/2021 | Mitric et al. | |
| 2022/0094385 A1* | 3/2022 | Degani | H03L 7/16 |

OTHER PUBLICATIONS

"Section 1. Fundamentals of DDS Technology," Analog Devices, Inc. 1999. 7 pages.
"Frequency Measurements: How-To Guide," Feb. 5, 2021, 6 pages.
"Frequency synthesizer," Wikipedia, acccessed from Internet on Jun. 3, 2021, at: https://en.wikipedia.org/wiki/Frequency_synthesizer, 6 pages.
Murphy, E. and Slattery, C., "Ask The Application Engineer—33 All About Direct Digital Synthesis," Analog Dialogue 38—Aug. 8, 2004. pp. 1-5.
Kourani, et al., "A 150 MHz voltage controlled oscillator using lithium niobate RF-MEMS resonator," Jun. 2017, 5 pages.
International Search Report, PCT/US22/34147, dated Jul. 26, 2022, 8 pages.

* cited by examiner

DIRECT DIGITAL SYNTHESIZER WITH FREQUENCY CORRECTION

FIELD OF THE DISCLOSURE

The present disclosure relates to frequency synthesis, and more particularly, to a direct digital synthesizer configured with frequency correction.

BACKGROUND

A frequency synthesizer can be used to generate a range output frequencies based on a clock signal. The resulting output signal can be used in any number of applications, such as to provide a stable clock or carrier signal, or some other frequency signal of interest. Such synthesized frequency signals can be used in many electronic systems, such as communication and detection systems, both wired and wireless. Example characteristics of such synthesized signals include frequency (e.g., pertaining to the band of operation and a rough measure of throughput or bandwidth or capacity), and frequency stability and phase noise, among other characteristics.

Frequency stability includes, for example, the variation of a clock signal over a period of seconds or more (also called wander) and is measured by metrics such as Allan Variance. Frequency stability is expressed in ppm or ppb (parts per million or parts per billion) and is associated with aging (typically 10 years), temperature (over the operating temperature range), initial accuracy (part-part variation), and susceptibility to other environmental factors such as supply and DC bias. Phase noise refers to, for example, variations of a carrier signal out to a bandwidth of half the carrier frequency and is due to circuit and resonator noise. Spurs are (deterministic rather than random) harmonic signals in the spectrum of, for example, a clock output due to coupling or intermodulation or truncation artifacts among others. Phase noise and frequency stability specifications are oftentimes dictated by the requirements of the application. One example of such specification is a stability requirement of well under a ppm, for instance.

Spectrally pure output frequency signals can be generated by resonators with a high quality (Q) factor, a measure of their ability to maintain an oscillation at an exact frequency with minimal energy dissipation or loss. Ideally, a high Q resonator at the precise frequency in conjunction with a low noise oscillator circuit would be sufficient to generate the desired clock/carrier signal.

However, it is not practical to manufacture resonators for each and every frequency that is required for a given application. Further, maintaining frequency stability and controlling manufacturing accuracy to a certain specification (e.g., 10 GHz+/−10 ppb) becomes more difficult as the frequency signal to be generated increases. A phase locked loop (PLL) can be used to tune the output frequency by using a reference frequency from a module called an OCXO or TCXO (oven-controlled crystal oscillator or temperature-compensated crystal oscillator) which is designed to provide a precise frequency. While a PLL can multiply up frequencies, it is slow to tune to a new frequency. Thus, for applications requiring fast jumps to a new frequency, a circuit called a direct digital synthesizer (DDS) can be used instead. Conversely, while a DDS is fast, it produces frequencies less than half of its input frequency.

There is a need, therefore, for frequency synthesis techniques that can generate relatively high frequency output signals.

DETAILED DESCRIPTION

Figure 1:
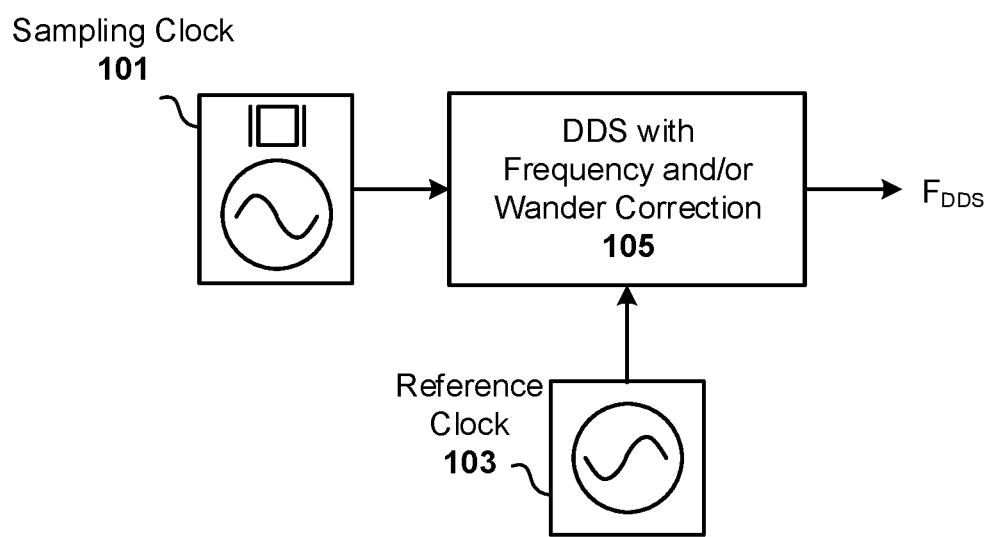
FIG. 1 is a block diagram illustrating a direct digital synthesizer (DDS) system configured with frequency correction, in accordance with an embodiment of the present disclosure.

Techniques are disclosed for direct digital synthesis with frequency correction. The techniques can be implemented, for example, in a direct digital synthesizer (DDS) that includes a DDS architecture operatively coupled with a local high frequency sampling clock and a local lower frequency standard. The DDS architecture corrects for frequency error (including that attributable to temperature-induced frequency variation or "wander") of the local high frequency sampling clock using the local lower frequency standard. In particular, the DDS architecture uses knowledge of the period of the lower frequency standard clock to correct the update word (frequency control word) in the sampling clock phase accumulator. In an embodiment, the local high frequency clock is implemented using high frequency mmWave (e.g., between 1 GHz and 300 GHz) resonator to supply a free-running sampling clock to the DDS, and the local lower frequency standard is implemented with an oven controlled crystal oscillator (OCXO) or temperature compensated crystal oscillator (TCXO). Use of a local resonator-generated free-running sampling clock allows for a clean and high Q sampling clock that has relatively low size, weight, power and cost (SWaP-C). Because the DDS architecture as provided herein is tolerant of a variable sampling frequency, the tuning range and centering specifications on the sampling clock are eased making resonator manufacture considerably easier. Frequency correction, as well as other functions such as noise filtering and spur tagging, can be implemented in the digital domain which can be efficiently implemented in semiconductor processes (e.g., complementary metal oxide semiconductor, or CMOS processes). While the techniques are particularly useful with a high frequency (e.g., frequencies in the multi-GHz range, such as mmWave frequencies) sampling clock, they can also be used to generate arbitrary lower frequencies and can be used into many applications as a general purpose frequency generator.

General Overview

A frequency synthesizer is an electronic circuit that generates a range of output frequencies from a given clock frequency. Although there are many applications where frequency synthesizers can be used, some examples include radio frequency (RF) receivers, mobile telephones, and GPS systems, to name a few. A frequency synthesizer may be implemented with a direct digital synthesizer (DDS). A DDS generally includes a phase accumulator, a phase-to-amplitude converter, and a digital-to-analog converter (DAC), and operates to generate a frequency-tunable and phase-tunable output signal that is referenced to the given clock frequency. In operation, the given clock frequency is divided down within the DDS by a scaling factor defined via a programmable binary tuning word (sometimes called a frequency control word). The greater the number of bits included in the tuning word, the greater the resolution to which the output frequency can be tuned. As noted above, while DDSs are generally fast in transitioning from one output frequency to another (fast hop times), they are limited with respect to maximum achievable output frequency. In particular, a given DDS produces frequencies less than half of its given clock frequency and may not have as spectrally pure an output clock (e.g., relative to a high-Q oscillator) due to digital truncation artifacts and digital-to-analog non-linearity impacts. The stability and accuracy of the DDS's output frequency are related to the stability and accuracy of the given clock frequency, so any variation such as that induced by changes in temperature can be problematic for some applications. Thus, there is a need for frequency synthesis techniques that can generate relatively high frequency output signals.

Thus, and in accordance with an embodiment of the present disclosure, a direct digital synthesizer (DDS) circuit. The circuit includes a first input to receive a first fixed frequency clock signal having a first frequency (sampling clock), a second input to receive a second fixed frequency clock signal having a second frequency lower than the first frequency (reference clock), and an output to provide an output frequency that is based at least in part on a frequency control word (FCW). The DDS circuit may include a frequency correction circuit having a first input to receive the first clock signal, a second input to receive the second clock signal, and a third input to receive the FCW, and an output to provide a frequency error of the first clock signal, the frequency error determined using the second clock signal and FCW. Alternatively, or in addition to, the DDS circuit may include an all-digital phase lock loop (AD-PLL) to correct for frequency wander of the first clock signal, using the second clock signal and FCW. In particular, the DDS circuit uses knowledge of the period of the second clock signal to correct the frequency control word.

Note in some embodiments where a low-wander clock is used to provide the first clock signal, no AD-PLL is included. Rather, in such cases, the frequency correction circuit provides frequency correction with respect to the first clock signal. In other embodiments where the first clock signal is more susceptible to wander, then the AD-PLL can be included to correct for that wander. In some such cases that include the AD-PLL, no frequency correction circuit is included. In still other embodiments, both the frequency correction circuit and the AD-PLL are included.

A number of benefits may be attributable to DDS architectures provided herein, according to some example embodiments. For example, the use of resonators with higher Q to generate mmWave clocks is enabled, because the architecture is tolerant of imprecise initial frequency and variation over temperature and aging sometimes attributable to such resonators. In addition, the techniques disclosed herein can be used to allow for correcting the frequency in the DDS using an input from a local frequency standard such as an OCXO. In some embodiments, an all-digital PLL is used to mitigate the wander in the resonator frequency. In addition, the techniques disclosed herein can be used to perform spur cancellation and tagging based on knowledge of the frequency control word. In addition, the techniques disclosed herein can be used to provide relatively good SWaP-C, and can thus further be used to enable distributed systems (e.g., phased arrays) and multi-function RF apertures.

DDS Architecture

FIG. 1 is a block diagram illustrating a direct digital synthesizer (DDS) system configured with frequency correction, in accordance with an embodiment of the present disclosure. As can be seen, the system includes a first clock 101 (sampling clock), a second clock 103 (reference clock), and a DDS 105. The DDS 105 is configured with frequency correction, in that it corrects for frequency error, including that attributable to frequency wander of sampling clock 101. Such error and/or wander may be induced, for example, by temperature change and/or age of sampling clock 101. According to an embodiment, clock 101 is a relatively high frequency clock (e.g., ≥1 GHz) and clock 103 is a relatively low frequency clock (e.g., <1 GHz). In operation, DDS 105 corrects for frequency error of sampling clock 101 using reference clock 103, and outputs a relatively accurate frequency signal, $F_{DDS}$.

In an embodiment, sampling clock 101 is implemented using high frequency mmWave resonator-based oscillator to supply a free-running sampling clock to the DDS 105, and reference clock 103 is implemented with an oven-controlled crystal oscillator (OCXO) or temperature-compensated crystal oscillator (TCXO) to supply a lower frequency reference clock to the DDS 105. In one such example case, the frequency of clock 101 is in the range of 1 GHz to 300 GHz (e.g., 35 GHz to 45 GHz), and the frequency of clock 103 is in the range of 50 MHz to 500 MHz (e.g., 100 MHz). In one specific such example case, the resonator of clock 101 is implemented using a high-Q lithium niobate (LiNbO3) or silicon carbide (SiC) resonator, and the oscillator portion of the clock 101 can be implemented in silicon, silicon germanium (SiGe), or group III-V material. Clock 103 can be implemented, for example, with quartz or other suitable material. In some embodiments, clocks 101 and/or 103 may be photonic (e.g., laser-based). In any such cases, note that clock 101 may or may not be susceptible to frequency wander. Further note that any number of output frequencies as well as any number or resonator and semiconductor materials can be used with respect to clocks 101 and 103, depending on the application at hand, and the present disclosure is not intended to be limited to any particular clock technologies.

Each of clocks 101 and 103, with DC power applied, output frequency signals (e.g., sine wave, square wave, etc.). In one example case, the output of clock 101 is a high-frequency low noise clock that may be inaccurate and imprecise and prone to non-trivial variation both inherently and in response to changes in temperature and/or aging, and clock 103 generates a relatively accurate and stable lower frequency output over a large range of temperatures and long lifespan. To this end, reference clock 103 provides a reliable and known period that can be used to correct clock 101.

DDS 105 corrects for frequency error and/or wander of clock 101 using the frequency standard provided by clock 103. In some embodiments where clock 101 is a low-wander clock, DDS 105 includes a frequency correction circuit having a first input to receive a first fixed frequency clock signal from clock 101, a second input to receive a second fixed frequency clock signal from clock 103, and a third input to receive a frequency control word. With these inputs and DC power applied, the frequency correction circuit outputs a frequency error of the first fixed frequency clock signal of clock 101. The frequency error is determined using the second fixed frequency clock signal of clock 103 and the frequency control word. With no or negligible frequency wander attributable to clock 101, no further frequency correction is needed. Further details of the frequency correction circuit will be provided with reference to FIGS. 2a-c. On the other hand, in cases where clock 101 is susceptible to relatively high-wander, DDS 105 includes an all-digital phase lock loop (AD-PLL) to correct frequency wander of the first fixed frequency clock signal of clock 101. Because the AD-PLL can correct for wander (and therefore frequency error), the frequency correction circuit used for low-wander clocks is now optional. Further details of the AD-PLL will be provided with reference to FIGS. 3 and 4. Still other example embodiments include both the frequency correction circuit and the AD-PLL.

Frequency Correction

Figure 2A:
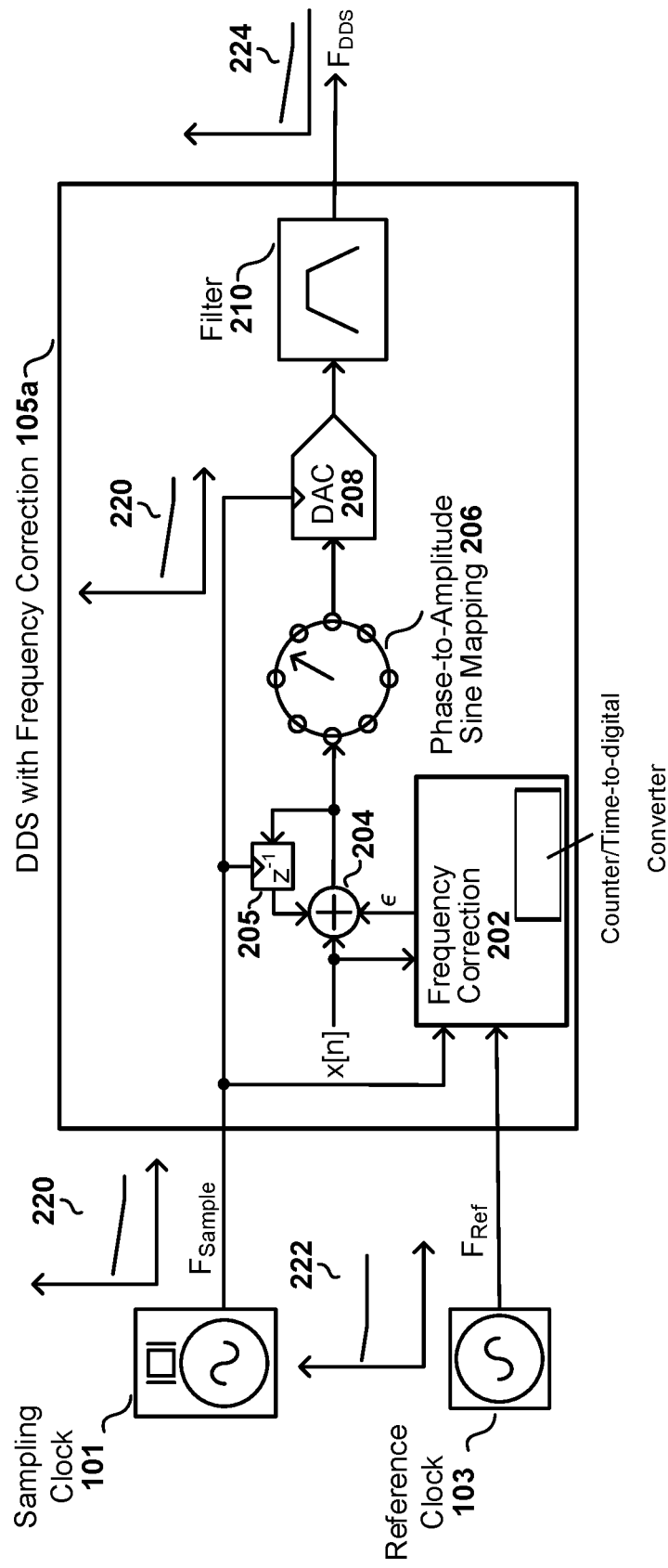
FIG. 2a is a block diagram illustrating further details of a DDS system configured in accordance with an embodiment of the present disclosure.

FIG. 2a is a block diagram illustrating further details of a DDS system configured in accordance with an embodiment of the present disclosure. In some example embodiments, sampling clock 101 is a resonator-based free-running clock that outputs $F_{Sample}$ and is a relatively high frequency but low-wander clock (with respect to a given standard) as indicated at 220, and reference clock 103 is a crystal oscillator that outputs $F_{Ref}$ and is a relatively lower frequency and low-wander clock (with respect to a given standard) as indicated at 222.

As can be further seen, DDS 105a is configured with frequency correction, and includes a frequency correction circuit 202, a phase accumulator including summing junction 204 and register 205, phase-to-amplitude sine mapping 206, a digital-to-analog converter 208, and a filter 210. In operation, frequency correction circuit 202 receives each of $F_{Sample}$, $F_{Ref}$, and the frequency control word x[n] and determines a fractional frequency error. As can be further seen, the frequency control word x[n] is corrected in the sampling clock phase accumulator (204 and 205), based on the frequency error. Register 205 of the phase accumulator is clocked by $F_{Sample}$ (and thus provides a delay of one cycle of the sampling clock), and the phase accumulator effectively operates to convert frequency to phase, and in particular derives a phase value the frequency control word x[n] after it has been corrected. The phase-to-amplitude sine mapping 206 receives that phase value and translates that it into digital amplitude data (e.g., sine or cosine amplitude). The DAC 208 translates that digital amplitude data into a corresponding analog signal, which is filtered by filter 210 to remove artifacts of the signal reconstruction process. The resulting output frequency signal $F_{DDS}$ is an accurate low-wander clock signal, as indicated at 224. In this example embodiment, note that $F_{DDS}$ will be less than half the sampling clock frequency ($F_{DDS}<F_{Sample}/2$).

Each of the phase accumulator summing junction 204, register 205, phase-to-amplitude sine mapping 206, DAC 208, and filter 210 can be implemented with standard or proprietary technology. In some example embodiments, phase-to-amplitude sine mapping 206 includes a look-up table that translates the phase value derived from the adjusted frequency control word into amplitude data. For example, phase-to-amplitude sine mapping 206 can be accomplished using a read-only memory (ROM) or other suitable memory that stores amplitude data indexed by phase values. The resolution of DAC 208 can vary from one embodiment to the next, but in some example cases is 10-14 bits. The filter 210 can be any number of filters, such as a bandpass filter having its center frequency set a $F_{DDS}$. Further note that other embodiments may have a different degree of integration. For instance, in some other embodiments, the phase accumulator including summing junction 204 and register 205 may be integrated into the frequency correction circuit 202, rather than be separate therefrom.

Frequency correction circuit 202 determines frequency error by determining the ratio of the sampling clock $F_{Sample}$ to the reference clock $F_{Ref}$. This can be accomplished, for example, by using a counter and/or a time-to-digital converter (TDC). The frequency correction can be a one-time correction (e.g., at power-up or during some initialization process) or ongoing to track temperature (e.g., such as in response to a sensor indication that temperature has changed and/or based on the expiration of a clock that triggers periodic frequency corrections according to a preset schedule). Further details of the frequency correction circuit 202, according to an embodiment, are provided with reference to FIGS. 2b-c. Variations will be apparent in light of this disclosure. For instance, in some other embodiments, the frequency correction circuit 202 includes one or more time-to-digital converters to determine the error of the first frequency clock signal with respect to the second fixed frequency clock signal.

Figure 2B:
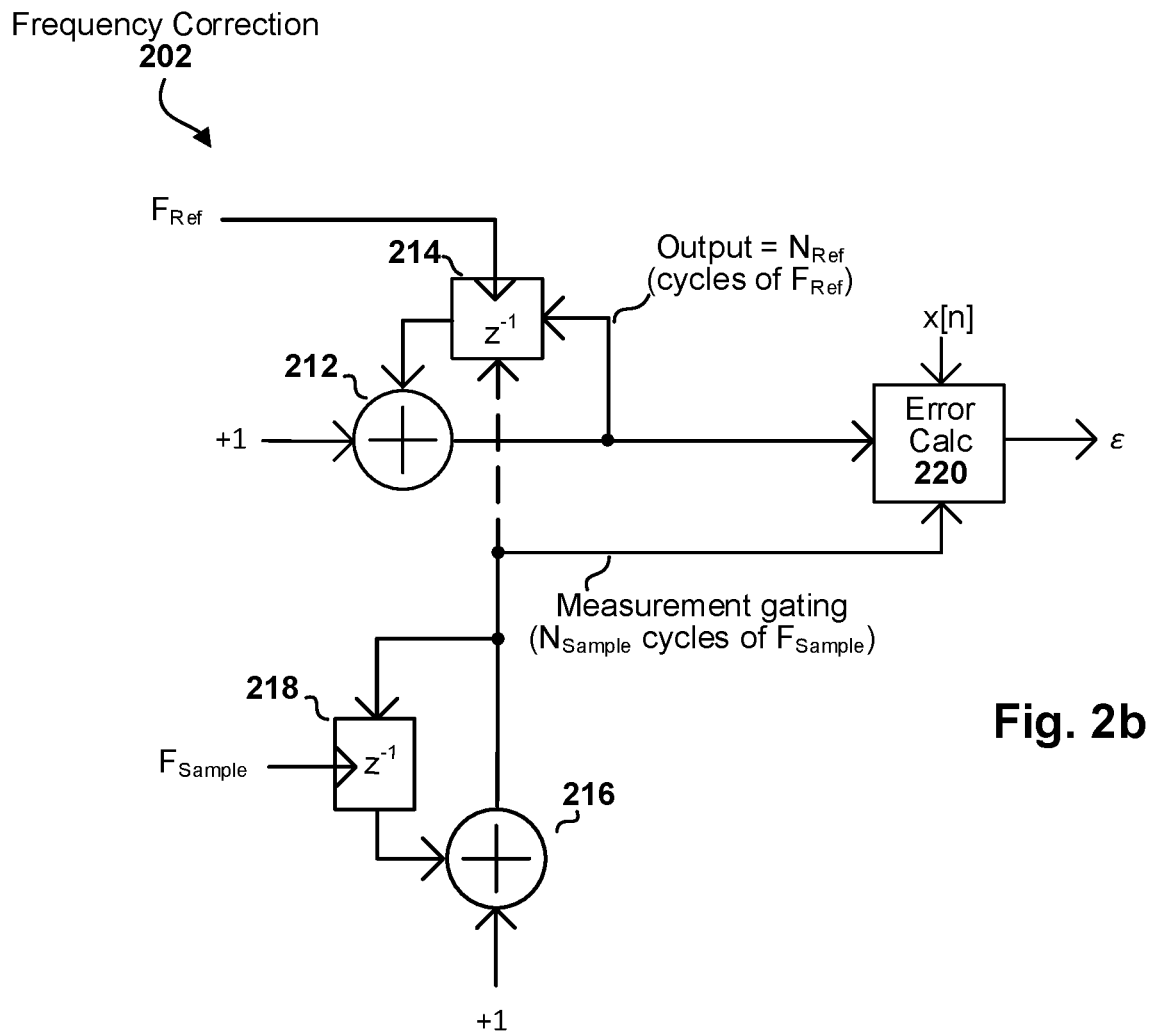
FIG. 2b is a block diagram illustrating a frequency correction circuit configured for use in the DDS system of FIG. 2a, in accordance with an embodiment of the present disclosure.

FIG. 2b is a block diagram illustrating frequency correction circuit 202 configured in accordance with an embodiment of the present disclosure. As can be seen, circuit 202 includes two counters. The first counter counts the number of $F_{Ref}$ cycles ($N_{Ref}$) while measurement is enabled (gated) and includes a first accumulator made up of summing junction 212 and register 214, and the second counter counts the number of $F_{Sample}$ cycles ($N_{Sample}$) and includes a second accumulator made up of summing junction 216 and register 218. As can be further seen, register 214 provides a delay of one clock cycle (with respect to $F_{Ref}$), and register 218 provides a delay of one clock cycle (with respect to $F_{Sample}$). Error calculation 220 computes frequency error $\epsilon$, which is the measured frequency error in $F_{Sample}$ and effectively provides a frequency control word correction factor that is received at summing junction 204 of FIG. 2a. According to an embodiment, error calculation 220 is configured to compute frequency error c, in accordance with Equations 1 through 3 below.

$$F_{Sample} \sim \frac{N_{Sample}}{N_{Ref}} F_{Ref} - \text{Residue} \quad (1)$$

$$\text{err} \sim 1 - \frac{F_{Sample\_ideal}}{F_{Ref}} \frac{N_{Ref}}{N_{Sample}} \quad (2)$$

$$\epsilon = \text{err} * x[n] \quad (3)$$

In Equation 1, note that residue refers to the residue (less than one complete cycle) of $F_{Ref}$ (as measured using $F_{Sample}$ for measurement gating), and may be ignored in some cases (set to zero), but in other cases can be accounted for to further increase accuracy, as further explained with reference to FIG. 2c. In still other example embodiments, residue is measured in terms of $F_{sample}$, although measuring the residual of a lower frequency signal will generally be easier. Ignoring the residue, the fractional frequency error can be expressed as shown in Equation 2, where $F_{sample\_ideal}$ is the nominal or ideal expected sample frequency. The frequency error ε is the resulting fractional frequency error times the given control word x[n].

Figure 2C:
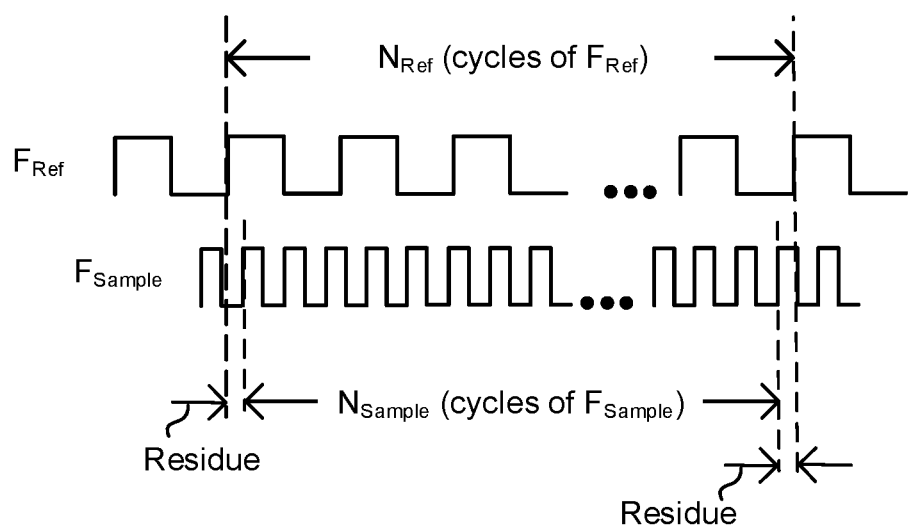
FIG. 2c is a timing diagram illustrating operation of the frequency correction circuit of FIG. 2b, in accordance with an embodiment of the present disclosure.

FIG. 2c is a timing diagram illustrating operation of the frequency correction circuit of FIG. 2b, in accordance with an embodiment of the present disclosure. As can be seen in this example scenario, there are $N_{Ref}$ cycles of the $F_{Ref}$ signal (generated by lower frequency reference clock 103) for every $N_{Sample}$ cycles of the $F_{Sample}$ signal (generated by the higher frequency sampling clock 101). For the given measurement time period (T), $N_{Sample}$ is the integer number of cycles of the $F_{sample}$ signal, as the counter (accumulator) including 216 and 218 is edge-triggered on $F_{Sample}$ (and thus counts periods of $F_{Sample}$), which in turn is used for measurement gating the $F_{Ref}$ counter (accumulator) including 212 and 214. As such, it is possible a residual of $F_{Ref}$ will be included in the measurement time period. This residue is delineated with dashed lines in FIG. 2c. Note that the total residue can be the sum of start and end residues, as shown in this example. While such residue can be ignored in some embodiments, it can be accounted for in other embodiments to further improve accuracy. In the latter case, the frequency correction circuit may further include, for example, a time-to-digital converter to account for residue of the second fixed frequency clock signal (assuming the first fixed clock frequency is being used for measurement gating). Any number of edge detection circuits can be used to assess the residual time based on the rising and falling edges the define the residual time period. Note that the measurement time period (T) is an integer number of periods of the $F_{Sample}$, in this example embodiment.

Frequency Correction and/or Wander Correction

Figure 3:
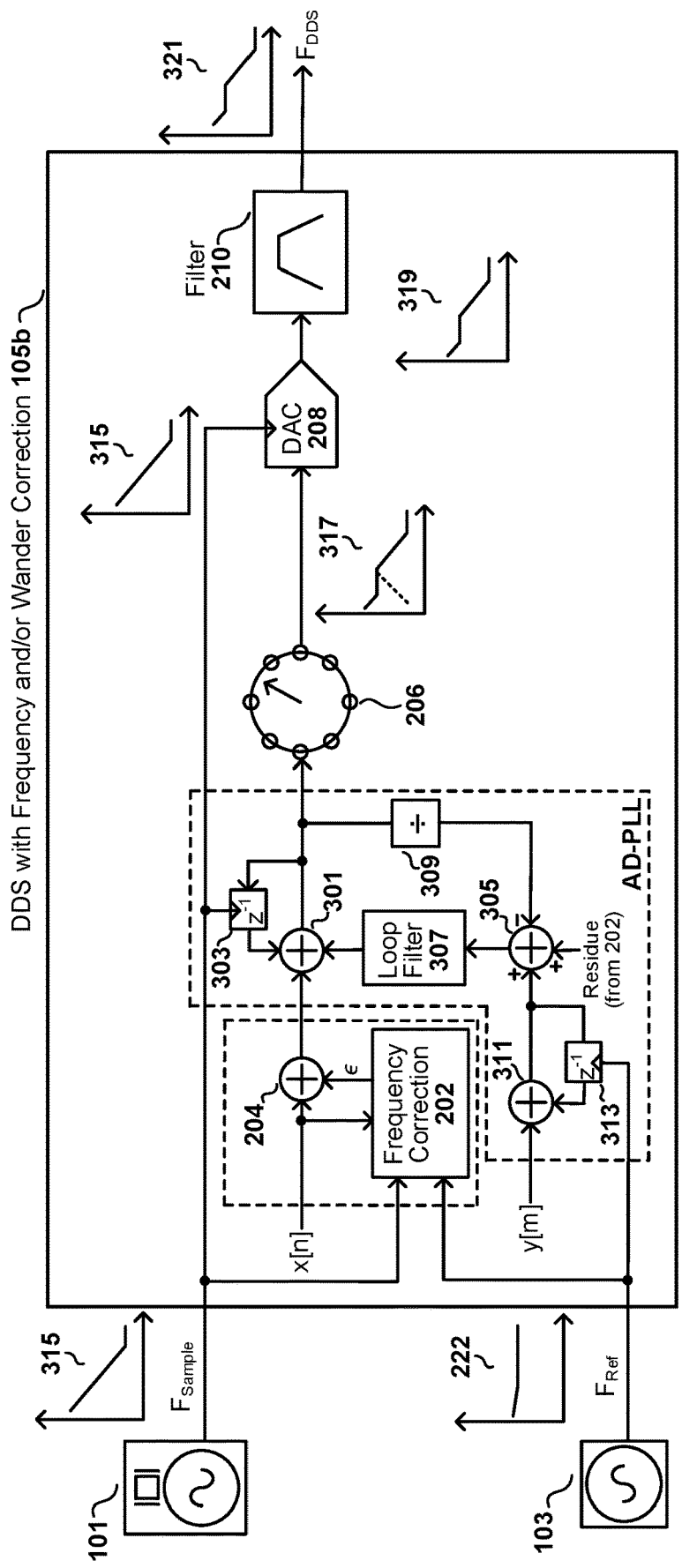
FIG. 3 is a block diagram illustrating further details of a DDS system configured in accordance with another embodiment of the present disclosure.

FIG. 3 is a block diagram illustrating further details of a DDS system configured in accordance with another embodiment of the present disclosure. In this particular example, clock 101 is resonator-based free-running clock that outputs $F_{Sample}$ and is a relatively high frequency and high-wander clock (with respect to a given standard) as indicated at 315, and clock 103 is a crystal oscillator that outputs $F_{Ref}$ and is a relatively lower frequency and low-wander clock (with respect to a given standard) as indicated at 222.

As can be further seen in the example of FIG. 3, DDS 105b is configured with frequency correction and/or wander correction. If included, the frequency correction can be carried out by 202 as previously discussed with respect to FIGS. 2a-c, and that previous relevant discussion is equally applicable here, except note that there is no register 205 and the summing junction 204 generates an corrected frequency control word x[n], which is then applied to a downstream phase accumulator included in the AD-PLL, as will be discussed in turn.

Wander correction can be carried out by an all-digital phase lock loop (AD-PLL). Note in some example embodiments, the wander correction attributable to the AD-PLL may provide sufficient frequency correction on its own, without the frequency correction provided by 202. In such cases, DDS 105b may not include 202 or the upstream phase accumulator (204 and 205), and the control word x[n] can be applied directly to the AD-PLL. In still other example cases, both frequency correction and wander correction are provided. Such a hybrid embodiment may be desirable, for instance, to center the output frequency quickly by means of a faster measurement (relative to slower settling attributable to an AD-PLL), and/or to use a residue measurement to reduce quantization noise in the AD-PLL. In any such cases, the frequency correction and/or wander correction can be a one-time correction (e.g., such as at power-up or during some initialization process) or ongoing to track temperature (e.g., such as in response to a sensor indication that temperature has changed and/or based on the expiration of a clock that triggers periodic corrections).

The AD-PLL includes: a controlled oscillator that effectively includes summing junction 301 and register 303 (which provides one clock cycle delay, with respect to $F_{Sample}$); a subtractor 305; a loop filter 307 which in this example case is implemented with proportional and integral (P+I) paths; and a feedback signal divider 309 coupled between an input of the subtractor 305 and an output of the controlled oscillator. Note that summing junction 301 and register 303 also effectively provide a first frequency-to-phase converter (phase accumulator for the sampling clock signal, $F_{Sample}$) that receives the frequency control word x[n] as input (or the corrected version of x[n], if frequency correction 202 is included), and is clocked by $F_{Sample}$. A second frequency-to-phase converter (phase accumulator for the reference clock signal, $F_{Ref}$) receives the frequency control word y[m] as input and is clocked by $F_{Ref}$, and includes summing junction 311 and register 313 (which provides one clock cycle delay, with respect to $F_{Ref}$).

In operation, the AD-PLL compares the phase of the divided down sampling clock $$\left(\phi_{FB} = \sum_n \frac{x[n]}{N_{Div}}\right)$$

to the phase of the reference clock ($\emptyset_{Ref} = \Sigma_m y[m]$) in subtractor 305. The output of subtractor 305 (the difference in phases of the reference clock and feedback sampling clock) is then conditioned by the P+I loop filter 307 to control the oscillator, thereby completing the loop. The output is then locked to a rational fraction multiple of the reference clock. The accumulators on the sampling clock (301 and 303) and reference clock (311 and 313) are converting frequency to phase. That is to say, the phase accumulators are incrementing on (counting) every cycle of their respective clock signal.

When the AD-PLL is in lock, the two phases march in lock step together. The following relationships can be derived in lock. If control word y[m] is a constant nominal value→y, for a given measurement time period T, $\emptyset_{Ref} = yF_{Ref}T$. If control word x[n] is a constant nominal value→x, for a given measurement time control period T, $$\phi_{FB} = \frac{xF_{Sample}}{N_{Div}}T,$$

where $N_{Div}$ is an integer divisor by which divider 309 divides down the sampling clock, $F_{Sample}$. If in lock, $\emptyset_{Ref} = \emptyset FB$ (within a given tolerance), and $$yF_{Ref} = \frac{xF_{Sample}}{N_{Div}}.$$

In some embodiments, the data is retimed to a given clock time domain (e.g., the sampling clock domain), if so needed, to enable signal processing operations in a single clock domain.

The phase-to-amplitude sine mapping 206 receives the phase value derived from the adjusted frequency control word from the AD-PLL and translates that phase value into digital amplitude data. The DAC 208 translates that digital amplitude data into a corresponding analog signal, which is filtered by filter 210 to remove artifacts of the signal reconstruction process. Note that the outputs of the phase-to-amplitude sine mapping 206 and DAC 208 have no or relatively low-wander, as indicated at 317 and 319, respectively. Thus, the resulting output frequency signal $F_{DDS}$ is an accurate low-wander clock signal, as indicated at 321. In this example embodiment, note that the synthesized frequency $F_{DDS}$ will be less than half the sampling clock frequency ($F_{DDS} < F_{Sample}/2$).

As can be further seen in the example embodiment of FIG. 3, when the residue is determined as discussed with reference to FIG. 2c, note that residue can be accounted for by applying the determined residue to summing junction 305, according to some example embodiments.

Quadrature DDS

As noted above, DDS architecture provides an output frequency that is less than half the sampling clock frequency ($F_{DDS} < F_{Sample}/2$). In some embodiments, a mixer can be added to the output of the DDS (e.g., so as to mix $F_{DDS}$ with $F_{Sample}$), thereby up-converting the output frequency to something greater than $F_{Sample}/2$. However, doing so may re-introduce wander of the high frequency sampling clock back into the $F_{DDS}$ output signal. One solution that can be used to mitigate such re-introduction of frequency wander is to sense to otherwise obtain phase noise information from the proportional path of loop filter 307, for example. This phase noise information can then be filtered and converted to the analog domain, and provided to modulate the bias of the downstream mixer that is upconverting the output frequency to cancel such phase noise.

Figure 4:
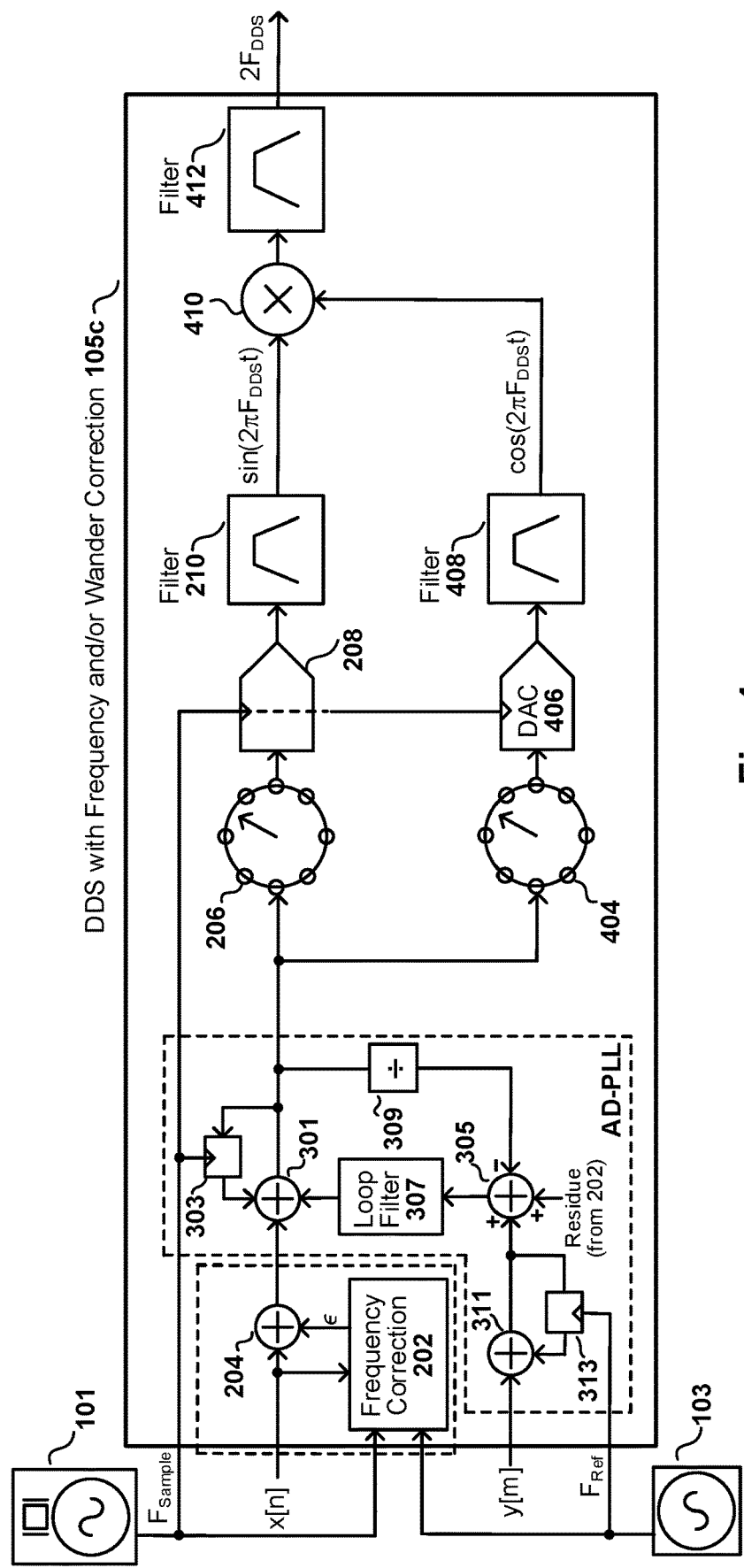
FIG. 4 is a block diagram illustrating further details of a DDS system configured in accordance with another embodiment of the present disclosure.

Another example embodiment to allow for increased frequency outputs without re-introducing wander of the sampling clock includes the use of a quadrature architecture, as shown in FIG. 4. As can be seen, the architecture is similar to that provided in FIG. 3, and the previous relevant discussion is equally applicable here, except that two processing channels are provided—one sine channel and one cosine channel. In more detail, the sine channel includes phase-to-amplitude sine mapping 206 (which can be sine-based in this example case), digital-to-analog converter 208, and filter 210, as previously discussed, and provides a first output frequency signal represented by $\sin(2p\, F_{DDS}t)$. In addition, the cosine channel includes phase-to-amplitude cosine mapping 404 (which can be cosine-based in this example case), digital-to-analog converter 406, and filter 408 (which can be similar to 206, 208 and 210, respectively, except with the noted sine/cosine change), and provides a second output frequency signal represented by $\cos(2p\, F_{DDS}t)$. The first and second output frequency signals are applied to mixer 410, and the output thereof is filtered by filter 412, thereby providing a no or otherwise low-wander, low error output frequency signal of $2\, F_{DDS}$.

As will be further appreciated, the DDS architectures provided herein can be used for, for instance, prioritizing outputs with reasonable phase noise, fast hopping, frequency flexibility, and modularity. Further note that the DDS architectures can be implemented with chip level integration, to provide a system-on-chip or chip set, according to some embodiments. For example, chip-scale high frequency resonators or other such sources can be used to generate the sampling and reference clocks, and much of the DDS circuitry can be implemented in the digital domain (e.g., from the sampling and reference clocks to digital-side of DAC).

Additional Example Embodiments

Example 1 is a direct digital synthesizer (DDS) circuit, comprising: a first input to receive a first fixed frequency clock signal having a first frequency; a second input to receive a second fixed frequency clock signal having a second frequency that is lower than the first frequency; and an output to provide an output frequency, the output frequency based at least in part on a frequency control word.

Example 2 includes the subject matter of Example 1, and includes a phase accumulator in which the frequency control word is adjusted, to correct for frequency error and/or frequency wander of the first fixed frequency clock signal, wherein the frequency error and/or frequency wander is determined based on a known fixed period of the second fixed frequency clock signal.

Example 3 includes the subject matter of Example 1 or 2, and includes a frequency correction circuit having a first input to receive the first fixed frequency clock signal, a second input to receive the second fixed frequency clock signal, and a third input to receive the frequency control word, and an output to provide a frequency error of the first fixed frequency clock signal, the frequency error determined using the second fixed frequency clock signal and the frequency control word.

Example 4 includes the subject matter of Example 3, wherein the frequency correction circuit includes: a first counter to count cycles of the first fixed frequency clock signal, thereby providing a first count; and a second counter to count cycles of the second fixed frequency clock signal, thereby providing a second count; wherein the frequency error is determined based on a ratio of the first count to the second count. In another example, the frequency correction circuit includes one or more time-to-digital converters to determine the error of the first frequency clock signal with respect to the second fixed frequency clock signal.

Example 5 includes the subject matter of Example 3 or 4, wherein the frequency correction circuit includes: a time-to-digital converter to account for a residual portion of the first or second fixed frequency clock signal.

Example 6 includes the subject matter of Example 1, and includes an all-digital phase lock loop (AD-PLL) to correct for frequency wander of the first fixed frequency clock signal.

Example 7 includes the subject matter of any of Examples 1 through 6, wherein the AD-PLL includes: a first frequency-to-phase converter to receive the first fixed frequency clock signal; a second frequency-to-phase converter to receive the second fixed frequency clock signal; a subtractor to receive outputs of the first and second frequency-to-phase converters and to determine a phase difference therefrom; a loop filter to receive output of the subtractor; and a feedback signal divider coupled between an input of the subtractor and an output of the first frequency-to-phase converter.

Example 8 includes the subject matter of any of Examples 1 through 7, including a phase-to-amplitude converter to receive phase data derived from a corrected version of the frequency control word; a digital-to-analog converter to receive an output of the phase-to-amplitude converter; and a filter to receive the output of the digital-to-analog converter.

Example 9 includes the subject matter of any of Examples 1 through 8, including a quadrature architecture having: a sine-based phase-to-amplitude converter to receive phase data derived a corrected version of the frequency control word; a first digital-to-analog converter to receive an output of the first phase-to-amplitude converter; a first filter to receive the output of the first digital-to-analog converter; a second phase-to-amplitude converter to receive phase data derived a corrected version of the frequency control word; a cosine-based digital-to-analog converter to receive an output of the second phase-to-amplitude converter; a second filter to receive an output of the second digital-to-analog converter; a multiplier to receive outputs of the first and second filters; and a third filter to receive an output of the multiplier.

Example 10 includes the subject matter of any of Examples 1 through 9, wherein the DDS circuit includes circuitry configured to periodically correct for frequency error and/or frequency wander of the first fixed frequency clock signal, using the second fixed frequency clock signal and the frequency control word, thereby allowing such correction to track changes in temperature.

Example 11 is a frequency synthesizer, comprising: a first clock source for providing a first fixed frequency clock signal having a first frequency; a second clock source for providing a second fixed frequency clock signal having a second frequency that is lower than the first frequency; and a direct digital synthesizer configured to correct for frequency error and/or frequency wander of the first clock source using the second clock source and a frequency control word.

Example 12 includes the subject matter of Example 11, wherein the first clock source includes an oscillator configured with a high-frequency resonator, the first frequency being above 1 GHz and the second frequency being below 1 GHz.

Example 13 includes the subject matter of Example 11 or 12, wherein the first frequency is between 1 GHz and 300 GHz, and the second frequency is between 1 MHz and 500 MHz.

Example 14 includes the subject matter of any of Examples 11 through 13, including a frequency correction circuit having a first input to receive the first fixed frequency clock signal, a second input to receive the second fixed frequency clock signal, and a third input to receive the frequency control word, and an output to provide a frequency error of the first fixed frequency clock signal, the frequency error determined using the second fixed frequency clock signal and the frequency control word.

Example 15 includes the subject matter of Example 14, wherein the frequency correction circuit includes: a first counter to count cycles of the first fixed frequency clock signal, thereby providing a first count; and a second counter to count cycles of the second fixed frequency clock signal, thereby providing a second count; wherein the frequency error is determined based on a ratio of the first count to the second count.

Example 16 includes the subject matter of Example 14 or 15, wherein the frequency correction circuit includes: a time-to-digital converter to account for a residual portion of the first or second fixed frequency clock signal; and/or a time-to-digital converter to determine the error of the first frequency clock signal with respect to the second fixed frequency clock signal.

Example 17 includes the subject matter of any of Examples 11 through 16, including an all-digital phase lock loop (AD-PLL) to correct frequency wander of the first fixed frequency clock signal, wherein the AD-PLL includes: a first frequency-to-phase converter to receive the first fixed frequency clock signal; second frequency-to-phase converter to receive the second fixed frequency clock signal; a subtractor to receive outputs of the first and second frequency-to-phase converter and to determine a phase difference therefrom; a loop filter to receive output of the subtractor; and a feedback signal divider coupled between an input of the subtractor and an output of the first frequency-to-phase converter.

Example 18 includes the subject matter of any of Examples 11-17, wherein the direct digital synthesizer is configured to correct for the frequency error and/or the frequency wander on a periodic basis.

Example 19 is an integrated circuit, comprising: a first input to receive a first fixed frequency clock signal having a first frequency between 1 GHz and 300 GHz; a second input to receive a second fixed frequency clock signal having a second frequency that is between 1 MHz and 500 MHz; and an output to provide an output frequency, the output frequency based at least in part on a frequency control word; wherein at least one of the first and second fixed frequency clock signals is a photonic signal. In some such examples, the integrated circuit includes a phase accumulator in which the frequency control word is adjusted, to correct for frequency error and/or frequency wander of the first fixed frequency clock signal, wherein the frequency error and/or frequency wander is determined based on a known fixed period of the second fixed frequency clock signal.

Example 20 includes the subject matter of Example 19, including: a frequency correction circuit having a first input to receive the first fixed frequency clock signal, a second input to receive the second fixed frequency clock signal, and a third input to receive the frequency control word, and an output to provide a frequency error of the first fixed frequency clock signal, the frequency error determined using the second fixed frequency clock signal and the frequency control word; and/or an all-digital phase lock loop (AD-PLL) to correct for frequency wander of the first fixed frequency clock signal.

The foregoing description of the embodiments of the present disclosure has been presented for the purposes of illustration and description. It is not intended to be exhaustive or to limit the present disclosure to the precise form disclosed. Many modifications and variations are possible in light of this disclosure. It is intended that the scope of the present disclosure be limited not by this detailed description, but rather by the claims appended hereto.

What is claimed is:

1. A direct digital synthesizer (DDS) circuit, comprising:
   a first input to receive a first fixed frequency clock signal having a first frequency;
   a second input to receive a second fixed frequency clock signal having a second frequency that is lower than the first frequency;
   an output to provide an output frequency, the output frequency based at least in part on a frequency control word; and
   a frequency correction circuit having a first input to receive the first fixed frequency clock signal, a second input to receive the second fixed frequency clock signal, and a third input to receive the frequency control word, and an output to provide a frequency error of the first fixed frequency clock signal, the frequency error determined using a ratio of the first fixed frequency clock signal and the second fixed frequency clock signal and the frequency control word;
   wherein the frequency correction circuit is configured to correct a frequency error and/or frequency wander of the first fixed frequency clock signal by summing an accumulated phase to the first fixed frequency clock, wherein the frequency error and/or frequency wander is determined based on a known fixed period of the second fixed frequency clock signal.

2. The DDS circuit of claim 1, wherein the frequency correction circuit includes:
a first counter to count cycles of the first fixed frequency clock signal, thereby providing a first count; and
a second counter to count cycles of the second fixed frequency clock signal, thereby providing a second count;
wherein the frequency error is determined based on a ratio of the first count to the second count.

3. The DDS circuit of claim 2, wherein the frequency correction circuit includes:
a time-to-digital converter to account for a residual portion of the first or second fixed frequency clock signal.

4. The DDS circuit of claim 1, including:
an all-digital phase lock loop (AD-PLL) to correct for a frequency wander of the first fixed frequency clock signal.

5. The DDS circuit of claim 4, wherein the AD-PLL includes:
a first frequency-to-phase converter to receive the first fixed frequency clock signal;
a second frequency-to-phase converter to receive the second fixed frequency clock signal;
a subtractor to receive outputs of the first and second frequency-to-phase converters and to determine a phase difference therefrom;
a loop filter to receive output of the subtractor; and
a feedback signal divider coupled between an input of the subtractor and an output of the first frequency-to-phase converter and providing, as an input, a feedback signal to the subtractor.

6. The DDS circuit of claim 1, wherein the DDS circuit includes circuitry configured to periodically correct for a frequency error and/or a frequency wander of the first fixed frequency clock signal, using the second fixed frequency clock signal and the frequency control word, thereby allowing such correction to track changes in temperature.

7. A frequency synthesizer, comprising:
a first clock source for providing a first fixed frequency clock signal having a first frequency;
a second clock source for providing a second fixed frequency clock signal having a second frequency that is lower than the first frequency;
a direct digital synthesizer configured to correct fora frequency error and/or a frequency wander of the first clock source using the second clock source and a frequency control word; and
wherein the direct digital synthesizer comprises:
a frequency correction circuit having a first input to receive the first fixed frequency clock signal, a second input to receive the second fixed frequency clock signal, and a third input to receive the frequency control word, and an output to provide a frequency error of the first fixed frequency clock signal, the frequency error determined using a ratio of the first fixed frequency clock signal and the second fixed frequency clock signal and the frequency control word;
wherein the frequency correction circuit is configured to correct a frequency error and/or frequency wander of the first fixed frequency clock signal by summing an accumulated phase to the first fixed frequency clock, wherein the frequency error and/or frequency wander is determined based on a known fixed period of the second fixed frequency clock signal.

8. The frequency synthesizer of claim 7, wherein the first clock source includes an oscillator configured with a high-frequency resonator, the first frequency being above 1 GHz and the second frequency being below 1 GHz.

9. The frequency synthesizer of claim 7, wherein the first frequency is between 1 GHz and 300 GHz, and the second frequency is between 1 MHz and 500 MHz.

10. The frequency synthesizer of claim 7, wherein the frequency correction circuit includes:
a first counter to count cycles of the first fixed frequency clock signal, thereby providing a first count; and
a second counter to count cycles of the second fixed frequency clock signal, thereby providing a second count;
wherein the frequency error is determined based on a ratio of the first count to the second count.

11. The frequency synthesizer of claim 7, wherein the frequency correction circuit includes:
a time-to-digital converter to account for a residual portion of the first or second fixed frequency clock signal and/or to determine the frequency error of the first fixed frequency clock signal with respect to the second fixed frequency clock signal.

12. The frequency synthesizer of claim 7, including an all-digital phase lock loop (AD-PLL) to correct frequency wander of the first fixed frequency clock signal, wherein the AD-PLL includes:
a first frequency-to-phase converter to receive the first fixed frequency clock signal;
a second frequency-to-phase converter to receive the second fixed frequency clock signal;
a subtractor to receive outputs of the first and second frequency-to-phase converters and to determine a phase difference therefrom;
a loop filter to receive output of the subtractor; and
a feedback signal divider coupled between an input of the subtractor and an output of the first frequency-to-phase converter and providing, as an input, a feedback signal to the subtractor.

13. The frequency synthesizer of claim 7, wherein the direct digital synthesizer is configured to correct for the frequency error and/or the frequency wander of the first clock source on a periodic basis.

14. An integrated circuit, comprising:
a first input to receive a first fixed frequency clock signal having a first frequency between 1 GHz and 300 GHz;
a second input to receive a second fixed frequency clock signal having a second frequency that is between 1 MHz and 500 MHz;
an output to provide an output frequency, the output frequency based at least in part on a frequency control word; and
a phase accumulator in which the frequency control word is adjusted to correct for frequency error and/or frequency wander of the first fixed frequency clock signal, wherein the frequency error and/or frequency wander is determined based on a known fixed period of the second fixed frequency clock signal.
wherein at least one of the first and second fixed frequency clock signals is a photonic signal.

15. The DDS integrated circuit of claim 14, including:
a frequency correction circuit having a first input to receive the first fixed frequency clock signal, a second input to receive the second fixed frequency clock signal, and a third input to receive the frequency control word, and an output to provide a frequency error of the first fixed frequency clock k signal, the frequency error determined using the second fixed frequency clock signal and the frequency control word; and/or an all-digital phase lock loop (AD-PLL) to correct for frequency wander of the first fixed frequency clock signal.

* * * * *